(12) United States Patent
Zhao

(10) Patent No.: US 10,138,390 B2
(45) Date of Patent: Nov. 27, 2018

(54) MODIFIED NANO-SILICA AND METHOD FOR PREPARING THE SAME, PIGMENT DISPERSION AND PHOTOSENSITIVE RESIN COMPOSITION

(71) Applicant: BOE TECHNOLOGY GROUP CO., LTD., Beijing (CN)

(72) Inventor: Ming Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 820 days.

(21) Appl. No.: 14/389,105

(22) PCT Filed: Dec. 11, 2013

(86) PCT No.: PCT/CN2013/089087
§ 371 (c)(1),
(2) Date: Sep. 29, 2014

(87) PCT Pub. No.: WO2015/018154
PCT Pub. Date: Feb. 12, 2015

(65) Prior Publication Data
US 2015/0299501 A1    Oct. 22, 2015

(30) Foreign Application Priority Data

Aug. 8, 2013 (CN) .......................... 2013 1 0344410

(51) Int. Cl.
| C09D 133/10 | (2006.01) |
|---|---|
| C09C 1/28 | (2006.01) |
| C09C 1/30 | (2006.01) |
| C09D 133/12 | (2006.01) |
| C09D 133/24 | (2006.01) |
| G02B 5/20 | (2006.01) |
| C09B 67/00 | (2006.01) |
| C09B 67/46 | (2006.01) |
| G03F 7/00 | (2006.01) |
| G03F 7/004 | (2006.01) |
| G03F 7/029 | (2006.01) |
| G03F 7/031 | (2006.01) |
| G03F 7/032 | (2006.01) |
| G03F 7/033 | (2006.01) |
| G03F 7/075 | (2006.01) |
| G03F 7/085 | (2006.01) |
| G03F 7/105 | (2006.01) |

(52) U.S. Cl.
CPC .......... C09D 133/10 (2013.01); C09B 67/009 (2013.01); C09B 67/0022 (2013.01); C09C 1/28 (2013.01); C09C 1/3081 (2013.01); C09D 133/12 (2013.01); C09D 133/24 (2013.01); G02B 5/206 (2013.01); G03F 7/0027 (2013.01); G03F 7/0047 (2013.01); G03F 7/029 (2013.01); G03F 7/031 (2013.01); G03F 7/033 (2013.01); G03F 7/0325 (2013.01); G03F 7/0751 (2013.01); G03F 7/085 (2013.01); G03F 7/105 (2013.01); C01P 2004/64 (2013.01)

(58) Field of Classification Search
USPC ........................ 106/31.9, 31.95, 31.6, 31.65
See application file for complete search history.

(56) References Cited

U.S. PATENT DOCUMENTS

| 7,803,221 B2* | 9/2010 | Magdassi .................... B41J 3/28 |
|---|---|---|
| | | 106/31.6 |
| 2009/0045360 A1* | 2/2009 | Wosnick ................. B41M 3/144 |
| | | 250/586 |
| 2009/0322670 A1 | 12/2009 | Bhowmik et al. |
| 2010/0330296 A1* | 12/2010 | Loccufier ............. C09D 11/101 |
| | | 427/511 |

FOREIGN PATENT DOCUMENTS

| CN | 101525501 A | 9/2009 |
|---|---|---|
| CN | 101558122 A | 10/2009 |
| CN | 101760042 A | 6/2010 |
| CN | 101928489 A | 12/2010 |
| CN | 101948561 A | 1/2011 |
| CN | 101985531 A | 3/2011 |
| CN | 102081301 A | 6/2011 |
| CN | 102093595 A | 6/2011 |
| CN | 102863823 A | 1/2013 |
| CN | 102911530 A | 2/2013 |
| CN | 103146262 A | 6/2013 |
| CN | 103497543 A | 1/2014 |
| JP | 2003-195484 A | 7/2003 |
| KR | 10-2010-0021993 A | 2/2010 |

OTHER PUBLICATIONS

International Search Report dated Nov. 12, 2013 corresponding to International application No. PCT/CN2013/089087.

(Continued)

Primary Examiner — Monique R Peets
(74) Attorney, Agent, or Firm — Nath, Goldberg & Meyer; Joshua B. Goldberg

(57) ABSTRACT

The invention relates to the field of materials technology and provides a modified nano-silica and a method for preparing the same, a pigment dispersion and a photosensitive resin composition, so as to solve the problem that conventional nano-silica cannot crosslink with other polymeric materials, and pigment dispersions are apt to aggregate and have a poor film-forming property. The modified nano-silica according to the invention has unsaturated double bonds on the surface thereof and can crosslink with other polymeric materials, such that the pigment dispersion comprising the modified nano-silica can effectively prevent agglomeration and has a good film-forming property, and the photosensitive resin composition comprising the pigment dispersion can reduce the thermal expansion of a film made thereby, as well as the occurrence of shrinkage and collapse phenomena in the surface of the film, and enhance the heat-resistance, chemical-resistance, mechanical properties and abrasion-resistance of the film.

13 Claims, No Drawings

(56) References Cited

OTHER PUBLICATIONS

Written Opinion of the International Searching Authority dated Nov. 12, 2013 corresponding to International application No. PCT/CN2013/089087.
First Office Action issued in corresponding Chinese Application No. 201310344410.3 along with English Translation.
Second Office Action issued in corresponding Chinese Application No. 201310344410.3.
Third Office Action issued in corresponding Chinese Application No. 201310344410.3.

* cited by examiner

MODIFIED NANO-SILICA AND METHOD FOR PREPARING THE SAME, PIGMENT DISPERSION AND PHOTOSENSITIVE RESIN COMPOSITION

This is a National Phase Application filed under 35 U.S.C. 371 as a national stage of PCT/CN2013/089087, filed Dec. 11, 2013, and claims priority benefit from Chinese Application No. 201310344410.3, filed Aug. 8, 2013, the content of each of which is hereby incorporated by reference in its entirety.

FIELD OF THE INVENTION

The present invention relates to the field of materials technology. More particularly, the present invention relates to a modified nano-silica and a method for preparing the same, a pigment dispersion comprising the modified nano-silica, and a photosensitive resin composition comprising the pigment dispersion.

BACKGROUND OF THE INVENTION

Currently, the method commonly used for preparation of a color filter is a pigment dispersing method, which is simple and can impart good resistance to light, heat and chemicals, and can provide stable performances, etc. The pigment dispersing method is a method in which a pigment dispersed in a resin, with an alkali-soluble resin, a photo-polymerizable monomer, an initiator and other additives being added thereto, is coated onto a transparent glass substrate that has been provided with a black matrix, and then the coated glass substrate is subjected to exposure, development and other photoetching processes so as to form the respective color layers (i.e., red, green, and blue photoresists) of a color filter.

However, in the pigment dispersing process, the three components including pigment, dispersant and binder resin should form a stable combination such that the resultant pigment paste can maintain excellent stability. In the system, the binder resin functions to increase the viscosity, provide steric hindrance effect among the pigment particles and effectively prevent the occurrence of agglomeration. However, with decrease of the primary particle size of a pigment itself from less than 100 nm to the current level of less than 50 nm, the dispersion of the pigment becomes more and more difficult, as the surface energy of the pigment particles per se increases such that the pigment particles in the paste are very prone to agglomerate, which will influence the effect of coating the dispersion to configure a photoresist.

When a photosensitive resin composition comprising the aforesaid pigment dispersion is coated and subjected to exposure and development to form a resin film, the resin film has a high tendency to shrink during the post-baking process such that dents on the film surface and shrinkage of the side wall may be observed. Such shrinkage will impact the following processes, such as coating of other organic film(s), sputtering of ITO, or the like.

SUMMARY OF THE INVENTION

An object of the present invention is to provide a modified nano-silica, so as to solve the problem that the nano-silica particles prepared by the conventional method cannot crosslink with other polymeric materials.

This object is achieved by a modified nano-silica having unsaturated double bonds grafted on its particle surface and having an average particle size in the range of 5 nm to 50 nm.

Preferably, the modified nano-silica particles have an average particle size in the range of 10 nm to 20 nm.

Normal inorganic particles, when being added to an organic pigment composition, cannot prevent the occurrence of pigment agglomeration, nor can they crosslink with a polymeric material in the pigment composition to form a network composite structure. Since the modified nano-silica particles according to the present invention have unsaturated double bonds on the surface thereof, they can crosslink with other polymeric materials. Meanwhile, since the modified nano-silica particles having the aforesaid particle size are much smaller than the size of the organic pigment capable of being dispersed, they will be separated by the steric hindrance effect of the binder resin covered on the surface of the pigment after they are added to the pigment paste and evenly dispersed. Furthermore, the unsaturated functional groups of the modified nano-silica are suitable for forming nodes of a crosslinked network that connect the chain segments of polymeric materials to form a network structure. Therefore, both the modified nano-silica particles and the pigment can be effectively prevented from agglomeration.

Another object of the present invention is to provide a method for preparing a modified nano-silica, comprising the following steps:

1) adding tetraethyl orthosilicate to a solution of a silane coupling agent containing a vinyl group, for example, by way of dropwise adding the tetraethyl orthosilicate or in any other manner that the tetraethyl orthosilicate can be added relatively slowly, and continuing the reaction after completion of the addition, thereby producing a precursor; and 2) aging the precursor to obtain modified nano-silica particles.

Preferably, the amount of the tetraethyl orthosilicate is in the range of 15 to 25 parts by mass, and the amount of the silane coupling agent containing a vinyl group is in the range of 3 to 10 parts by mass.

Preferably, at a reaction temperature of 50 to 80° C., the tetraethyl orthosilicate is added dropwise to the solution of the silane coupling agent containing a vinyl group over 2-3 hours (h), and after completion of the addition, the reaction is continued at the same temperature for 6-12 h.

Preferably, in the step of aging the precursor, the aging temperature is in the range of 110 to 160° C., and the aging time ranges from 8 to 30 h.

The solution of the silane coupling agent containing a vinyl group comprises the silane coupling agent and a solvent. The concentration of the silane coupling agent (mass %) may be in the range of 2% to 10%, preferably 5% to 8%. The solvent may be any solvent capable of dissolving the silane coupling agent containing a vinyl group, for example, ethanol, water, or a combination thereof, but it is not limited thereto. Further, the solution may contain ammonia so as to adjust the pH value of the solution between 7 and 9. Preferably, the silane coupling agent containing a vinyl group is one or more of vinyl trichlorosilane, vinyl trimethoxysilane, vinyl triethoxysilane, vinyl triisopropoxysilane, vinyl triacetoxysilane, γ-(methacryloxy)propyl trimethoxysilane, and the like.

The addition of the silane coupling agent containing a vinyl group not only imparts unsaturated double bonds to the surface of nano-silica particles, but also improves the dispersion state of the nano-silica particles themselves in an organic solvent. On one hand, the steric effect among the particles is increased such that their mutual agglomeration is suppressed. On the other hand, the lipophilicity of the organic groups on the surface of the particles is beneficial to the dispersion of the particles in an organic solvent. The number of double bonds on the surface of nano-silica particles can be controlled by adjusting the ratio of the silane coupling agent containing a vinyl group and the tetraethyl orthosilicate. As such, the surface of the nano-silica particles will not crosslink with too many chain segments to cause a sharp increase in local viscosity during crosslinking polymerization, but will maintain a relatively low degree of crosslinking. Thus, when the nano-silica particles are added in a pigment dispersion, a crosslinked network with the nano-silica particles serving as nodes can be established, while the viscosity property of the pigment dispersion will not be affected and it will remain in a low viscosity and stable state; otherwise, problems such as clogging will occur in the process of coating a photosensitive resin composition comprising the pigment dispersion.

Another object of the present invention is to provide a pigment dispersion which can effectively prevent agglomeration and has a good film-forming property, so as to solve the problem that the conventional pigment dispersion tends to agglomerate and has a poor film-forming property.

This object is achieved by a pigment dispersion prepared by dispersing a solute in a solvent and inducing a crosslinking reaction therein. The average particle size of the solid particles in the pigment dispersion ranges from 40 nm to 100 nm.

The solute comprises: based on 100% by mass of the pigment dispersion, 1% to 5% of a modified nano-silica of the present invention, 3% to 6% of a dispersant, 2% to 6% of a binder resin, 10% to 20% of pigment, and 0.1% to 0.5% of a photoinitiator.

The solvent used in the pigment dispersion may be any organic solvent which can provide effective dispersion, for example, but not limited to, propylene glycol monomethyl ether acetate, ethyl acetate, ethylene glycol monomethyl ether, n-butanol, ethyl ethoxypropionate, etc.

According to the present invention, modified nano-silica particles are added in the pigment dispersion to serve as crosslinking nodes, and the binder resin containing unsaturated double bonds in the dispersion is initiated to undergo crosslinking polymerization to form a network polymeric resin system in the dispersion, which will enhance the encapsulation and stabilization of the pigment particles and thus will effectively reduce the occurrence of particle agglomeration and precipitation.

Preferably, the solute further comprises 0.2% to 1% of quantum dots, based on 100% by mass of the pigment dispersion.

Preferably, the particle size of the quantum dots is in the range of 1 nm to 10 nm.

More preferably, the quantum dots are introduced during the stage of synthesizing the modified nano-silica. Specifically, the quantum dots are introduced into a solution of a silane coupling agent containing a vinyl group, and then tetraethyl orthosilicate is added to the resulting solution. After the reaction and aging processes, a composite structure of the quantum dots encapsulated by the modified nano-silica can be formed.

A quantum dot is a semi-conductor nanostructure of which the excitons are confined in all three spatial dimensions. A quantum dot is typically composed of a semiconductor material, such as CdS, CdSe, CdTe, ZnSe, InP, InAs, or the like, or it is composed of two or more kinds of semi-conductor materials, such as CdSe doped with ZnS, CdSe doped with ZnSe, or the like. The emission spectrum of a quantum dot can be controlled by adjusting its size. When a pigment dispersion comprising quantum dots is used to form a color filter, the respective quantum dots having various emission spectra absorb the light from a backlight and emit a fluorescence having a similar color to that of the corresponding sub-pixel regions where they locate, so that both the light received by an observer and the color gamut can be improved.

Preferably, the dispersant is a block copolymer composed of segment(s) having affinity to the solvent and segment(s) comprising a nitrogen atom-containing functional group. The amine value of the dispersant described above is in the range of 80 to 150 mg KOH/g.

It is further preferred that the block copolymer is one or more of acrylic block copolymers, polyurethane block copolymers, polyaminoamide block copolymers, polyether ester block copolymers, and aliphatic polycarboxylic acid block copolymers.

Preferably, the pigment is one or more of azo, phthalocyanine, quinacridone, benzimidazolone, indanthrene, and dioxazine pigments. In terms of color, various pigments useful in color filters can be used in the present invention, such as for example, blue pigments, green pigments, red pigments, yellow pigments, purple pigments, orange pigments, brown pigments, black pigments, and pigments of other colors.

Preferably, the binder resin has unsaturated double bonds. Since the unsaturated double bonds in the molecular chain of the binder resin can take part in the polymerization reaction, it functions to encapsulate the pigment particles, eliminate agglomeration of the particles and prevent the occurrence of sedimentation.

It is further preferred that the binder resin is one or more of polyvinyl alcohols, hydroxypropyl celluloses, carboxymethyl celluloses, hydroxyethyl celluloses, methyl celluloses, styrene-acrylic acid resins, styrene-acrylic acid-acrylate resins, styrene-maleic half ester resins, methacrylic acid-methacrylate resins, isobutylene-maleic acid resins, rosin-modified maleic acid resins, polyvinyl pyrrolidone, polyallylamine, polyvinyl chloride, chlorinated polypropylene, and polyethylene imine, each having unsaturated double bonds.

Preferably, the photoinitiator is any of benzoin and its derivatives, benzil, alkylphenone, acyl phosphorus oxides, benzophenones, thioxanthones, diaryl iodonium salts, friaryl iodonium salts, alkyl iodonium salts, and cumene ferrocene hexafluorophosphate. The photoinitiator is capable of absorbing the energy of a certain wavelength in the UV region (250 to 400 nm) or in the visible region (400 to 800 nm) to produce free radicals or cations, so as to initiate the polymerization and crosslinking/curing.

The method of preparing the pigment dispersion according to the present invention comprises the steps of:

mixing the aforesaid pigment, dispersant, binder resin and solvent to form a pigment-containing dispersion liquid; and adding the modified nano-silica (optionally encapsulating quantum dots) and a photoinitiator to the dispersion liquid, and inducing a crosslinking reaction under light (usually ultraviolet light) irradiation to produce the pigment dispersion.

Still another object of the present invention is to provide a photosensitive resin composition comprising: based on 100% by mass of the photosensitive resin composition, 30% to 40% of the pigment dispersion, 1.5% to 6% of an alkali-soluble resin, 2% to 5% of a polymerizable monomer, and 0.2% to 0.8% of a photoinitiator.

Preferably, the alkali-soluble resin is an acrylic copolymer. The acid value of the acrylic copolymer is in the range of 50 to 150. The acrylic copolymer having such an acid value can achieve good developing performance, while the undeveloped part will not be affected.

It is further preferred that the acrylic copolymer is selected from (meth)acrylic acid/methyl (meth)acrylate copolymer, (meth)acrylic acid/benzyl (meth)acrylate copolymer, (meth)acrylic acid/2-hydroxyethyl (meth)acrylate/benzyl (meth)acrylate copolymer, (meth)acrylic acid/methyl (meth)acrylate/styrene copolymer, (meth)acrylic acid/2-hydroxyethyl (meth)acrylate/benzyl (meth)acrylate/methyl (meth)acrylate copolymer, and (meth)acrylic acid/benzyl (meth)acrylate/N-phenyl maleimide copolymer, and the acrylic copolymer has an acid value in the range of 60-120. The acrylic copolymer having such an acid value can achieve good developing performance, while the undeveloped part will not be affected. As used herein, the term "(meth)acrylic acid" means acrylic acid and/or methacrylic acid. Similarly, "(meth)acrylate" means acrylate and/or methacrylate.

The polymerizable monomer is typically a photopolymerizable monomer. Preferably, the polymerizable monomer is one or more of hexylphenyl carbitol acrylate, N-vinyl pyrrolidone, 2-ethylhexyl carbitol acrylate, ethyl (meth)acrylate, bisphenol A bis(acryloxyethyl) ether, pentaerythritol tetra(meth)acrylate, acrylonitrile, styrene, and vinyl acetate.

The photoinitiator of the photosensitive resin composition may be selected from those photoinitiators described above with regard to the pigment dispersion, and can be the same as or different from the photoinitiator used in the pigment dispersion.

In addition to the above components, the photosensitive resin composition may further comprise a solvent added to meet the viscosity requirement of a coating operation. The added solvent may be selected from those solvents described above with regard to the pigment dispersion, and can be the same as or different from the solvent used in the pigment dispersion. Further, the photosensitive resin composition may also comprise conventional additives in the art, for example, leveling agents, photosensitizers, and the like.

In the present invention, the mixing and dispersing operations can be conducted by conventional dispersing and mixing machines, for example, a ball mill, a horizontal sand mill, a vertical sand mill, a ring sand mill, a supermicro attritor, a high-pressure nano homogenizer, a high-speed mixer, a high-speed stirring mill, a roll crusher, an ultrasonic disperser, a homogeneous mixer, and the like.

According to the present invention, a modified nano-silica having unsaturated double bonds is prepared, which can crosslink with other polymeric materials. By adding the modified nano-silica particles in a pigment dispersion, a crosslinking reaction can be induced in the pigment dispersion, which can aid the suspension of the pigment particles and thus reduce the settlement of the particles.

During the exposure stage after a photosensitive resin composition is prepared by adding an alkali-soluble resin, a polymerizable monomer, a photoinitiator and other additives to the pigment dispersion, a network structure is formed by the polymerization and crosslinking of the polymerizable monomer, which combines with the network crosslinked structure comprising the nano-silica particles in the pigment dispersion to form an interpenetrating composite network structure. The two kinds of network in the composite structure interpenetrate and cooperate with each other such that they can support each other in the post-baking stage, thereby reducing the thermal expansion of the resultant film as well as the occurrence of shrinkage and collapse phenomena in the surface of the film, and effectively enhancing the heat-resistance, chemical-resistance, mechanical properties and abrasion-resistance of the film, while maintaining the transparency and gloss of the film without any adverse effect on the optical properties of the photosensitive resin.

DETAILED DESCRIPTION OF CERTAIN EMBODIMENTS

To enable a person skilled in the art to have a better understanding of the technical solutions of the present invention, the following specific embodiments of the present invention are described in detail.

The average particle size described herein was measured by a laser nano particle size analyzer (ZS90, available from Malvern Instruments Co. Ltd., China).

The acid value and amine value described herein were measured using a pH meter according to the titration method, respectively.

The luminance described herein was measured by a color difference meter (Color i5, available from X-rite Inc., U.S.) under the following conditions: the light source is a pulsed xenon lamp, D65, the illumination ranges from 750 to 3200 Lux, and the detection power is 20 watts.

The materials used in Comparative Example and Examples are described below.

| Materials | Description |
| --- | --- |
| Anthraquinone red pigment PR177 | DIC Co., Ltd., ATY-R177 |
| Indanthrene Blue RS | Shanghai Yalian Pigment Chemicals Co., Ltd. |
| Benzimidazolone Yellow | Jiangxi Veco Pigment Co., Ltd., H4G PY151 |
| Carbazole dioxazine Violet 19 | Clariant Co., Ltd., RL COF01 |
| Propylene glycol monomethyl ether acetate | Dow Chemical Company |
| 2-hydroxy-2-methyl-1-phenyl acetone | Ciba Specialty Chemicals, OXE01 |
| Dibenzoyl phenyl phosphine oxide | Hubei Xinghengkang Chemical Technology Co., Ltd., photoinitiator TPO |
| p-benzoylphenoxy diphenyliodonium hexafluorophosphate | Shanghai PE biochem Co., Ltd., photoinitiator IHT-PI440 |
| Carboxymethyl cellulose | Haisheng Cellulose Derivatives Plant, Yinzhou, Ningbo City, CMC-1 |
| Polyvinyl pyrrolidone | Shanghai Westang Bio-Tech Co. Ltd., PVP-K30 |
| Methacrylic acid/methyl methacrylate copolymer | A self-made resin, molecular weight: 9700, acid value: 37.9, solid content: 40 wt % |
| Methacrylic acid/benzyl methacrylate/N-phenyl maleimide copolymer | A customized resin, molecular weight: 26600, acid value: 86.3, solid content: 29.1 wt % |
| Methacrylic acid/methyl methacrylate/styrene copolymer | BASF Corporation, Resin 611 |
| Methacrylic acid/benzyl methacrylate copolymer | Degussa Corporation, TEGO Variplus SK |
| Methacrylic acid/methyl methacrylate resin | A self-made resin, molecular weight: 9700, acid value: 37.9, solid content: 40 wt % |
| Acrylic acid-isobutylene-maleic anhydride resin | A self-made resin, molecular weight: 17500, acid value: 39.5, solid content: 11.7 wt % |
| Methacrylic acid/(2-hydroxyethyl methacrylate)/benzyl methacrylate/methyl methacrylate copolymer | A customized resin, molecular weight: 8400, acid value: 33.3, solid content: 37.9 wt % |
| Hexylphenyl carbitol acrylate | Sinopharm Corporation |
| Ethyl methacrylate | Sinopharm Corporation |
| Bisphenol A type bis (acryloxyethyl) ether | Hitachi Chemical Co., Ltd., FA-321M |
| Pentaerythritol tetra(meth)acrylate | Sinopharm Corporation |
| Styrene | Sinopharm Corporation |

Comparative Example

This comparative example provides a pigment dispersion, and a photosensitive resin composition comprising the pigment dispersion.

The pigment dispersion of this comparative example was prepared by mixing a solute with solvent and inducing reaction of the resultant mixture. The average particle size of the solid particles in the pigment dispersion is 200 nm, and the solute comprises, based on 100% by mass of the pigment dispersion, 1% of commercially available modified nano-silica (JR-NS01A, Xuancheng Jing Rui new Material Co., Ltd., particle size: about 20 nm), 3% of a dispersant, 6% of a binder resin, 20% of a pigment, 0.1% of a photoinitiator, and the rest of solvent.

The process for preparing the pigment dispersion comprises the steps of:
  weighing anthraquinone red pigment PR177 as a pigment, Disperbyk-137 as a dispersant, propylene glycol monomethyl ether acetate as a solvent, and a methacrylic acid/benzyl methacrylate copolymer as a binder resin, according to the aforesaid mass percentages, and mixing them in a disperser at a speed of 500 rpm for 1 h, and then dispersing the obtained mixture in a high speed stirring mill for 5 h after adding appropriate amount of zirconium oxide beads having an average particle size of 0.3 to 1.0 mm, and then removing the zirconium oxide beads after completion of milling, thereby obtaining a pigment-containing dispersion liquid; and
  adding the commercially available modified nano-silica and the initiator 2-hydroxy-2-methyl-1-phenyl acetone into the pigment-containing dispersion liquid under stirring, and inducing a crosslinking reaction, after stirring for 0.5 h, under the irradiation of a UV lamp (Double-sided Precision Exposure Machine GE-B8565, Beijing Zhengsheng Hongcheng Electronic Equipment Factory) for 30 s, thereby obtaining a pigment dispersion.

The photosensitive resin composition of the comparative example comprises (mass %): 32% of the pigment dispersion as prepared above, 1.5% of an alkali-soluble resin, 0.2% of a photoinitiator, 2% of a polymerizable monomer, and the rest of solvent.

The process for preparing the photosensitive resin composition comprises the steps of:
  weighing the pigment dispersion prepared in this comparative example, methacrylic acid/methyl methacrylate copolymer as an alkali-soluble acrylic copolymer resin (acid value: 150), hexylphenyl carbitol acrylate as a polymerizable monomer, and propylene glycol monomethyl ether acetate as a solvent, according to the aforesaid mass percentages, and mixing them in a ball mill at a speed of 500 rpm for 3 h, and then dispersing the obtained mixture in a high speed stirring mill for 5 h after adding appropriate amount of zirconium oxide beads having an average particle size of 0.3 to 1.0 mm, then removing the zirconium oxide beads after completion of milling, and then adding the photoinitiator, 2-thiobenzothiazole.

The resultant photosensitive resin composition was coated onto a transparent glass substrate provided with a black matrix. After a photoetching process including exposure for 20 s, development and so on, a color layer (i.e., a photoresist layer) of a color filter was obtained. The appearance of the photoresist layer was inspected, and the results are shown in Table 1.

A display panel comprising the color filter was prepared, and further was packaged in a display device. The brightness of the display device was tested at 20 watts, and the results are shown in Table 1.

Example 1

This example provides modified nano-silica particles and a method of preparing the same, as well as a pigment dispersion and a photosensitive resin composition comprising the same.

The modified nano-silica particles provided in this example have unsaturated double bonds grafted on the surface thereof, and have an average particle size of 5 nm.

The method for preparation of the aforesaid modified nano-silica particles comprises the following steps:
  1) the step of reacting to produce a nano-silica precursor: weighing 40 parts by mass of anhydrous ethanol, 5 parts by mass of deionized water, 6 parts by mass of 25% (v/v) ammonia, and 3 parts by mass of vinyl trimethoxy silane, and mixing them uniformly in a four-necked flask, then raising the temperature of the resultant mixture to 60° C., then slowly adding dropwise into the flask 15 parts by mass of tetraethyl orthosilicate over 2 h, and continuing the reaction for 11 h after completion of the addition, thereby obtaining the nano-silica precursor; and
  2) the step of aging the nano-silica precursor: transferring the nano-silica precursor obtained in Step 1) to a thermostatic reactor and aging for 8 h at 160° C., and then filtering the resultant precipitate, washing the "cake" three times with ethanol and drying it in vacuo, thereby obtaining modified nano-silica particles.

The pigment dispersion of this example was prepared by mixing a solute with solvent and inducing a crosslinking reaction therein. The average particle size of the solid particles in the pigment dispersion is 50 nm, and the solute comprises, based on 100% by mass of the pigment dispersion, 1% of the modified nano-silica, 3% of a dispersant, 6% of a binder resin, 20% of a pigment, 0.1% of a photoinitiator, and the rest 69.9% of solvent.

The process for preparing the pigment dispersion comprises the steps of:
  weighing anthraquinone red pigment PR177 as a pigment, Disperbyk-137 as a dispersant, propylene glycol monomethyl ether acetate as a solvent, and a methacrylic acid/benzyl methacrylate copolymer as a binder resin, according to the aforesaid mass percentages, and mixing them in a disperser at a speed of 500 rpm for 1 h, and then dispersing the obtained mixture in a high speed stirring mill for 5 h after adding appropriate amount of zirconium oxide beads having an average particle size of 0.3 to 1.0 mm, and then removing the zirconium oxide beads after completion of milling, thereby obtaining a pigment-containing dispersion liquid; and
  adding the modified nano-silica of this example and the initiator 2-hydroxy-2-methyl-1-phenyl acetone into the pigment-containing dispersion liquid under stirring, and inducing a crosslinking reaction, after stirring for 0.5 h, under the irradiation of a UV lamp (GE-B8565) for 30 s, thereby obtaining a pigment dispersion.

The photosensitive resin composition of this example comprises (mass %): 32% of the pigment dispersion as prepared above, 1.5% of an alkali-soluble resin, 0.2% of a photoinitiator, 2% of a polymerizable monomer, and the rest of solvent.

The process for preparing the photosensitive resin composition comprises the steps of:
  weighing the pigment dispersion prepared in this example, methacrylic acid/methyl methacrylate copolymer as an alkali-soluble acrylic copolymer resin (acid value: 150), hexylphenyl carbitol acrylate as a polymerizable monomer, and propylene glycol monomethyl ether acetate as a solvent, according to the aforesaid mass percentages, and mixing them in a ball mill at a speed of 500 rpm for 3 h, and then dispersing the obtained mixture in a high speed stirring mill for 5 h after adding appropriate amount of zirconium oxide beads having an average particle size of 0.3 to 1.0 mm, then removing the zirconium oxide beads after completion of milling, and then adding the photoinitiator, 2-thiobenzothiazole.

The resultant photosensitive resin composition was coated onto a transparent glass substrate provided with a black matrix. After a photoetching process including exposure for 20 s, development and so on, a color layer (i.e., a photoresist layer) of a color filter was obtained. The appearance of the photoresist layer was inspected, and the results are shown in Table 1.

A display panel comprising the color filter was prepared, and further was packaged in a display device. The brightness of the display device was tested at the same power as the Comparative Example, and the results are shown in Table 1.

Example 2

This example provides modified nano-silica particles and a method of preparing the same, as well as a pigment dispersion and a photosensitive resin composition comprising the same.

The modified nano-silica particles provided in this example have unsaturated double bonds grafted on the surface thereof, and have an average particle size of 10 nm.

The method for preparation of the aforesaid modified nano-silica particles comprises the following steps:

1) the step of reacting to produce a nano-silica precursor: dissolving quantum dots (CdTe, particle size: 10 nm) in anhydrous ethanol to form a solution of the quantum dots; and weighing 20 parts by mass of anhydrous ethanol, 2 parts by mass of deionized water, 2 parts by mass of 25% (v/v) ammonia, 10 parts by mass of vinyl trichlorosilane, and predetermined amount of the quantum dots solution (based on the mass of the modified nano-silica finally obtained, the amount of the quantum dots being 5%), and mixing them uniformly in a four-necked flask, then raising the temperature of the resultant mixture to 80° C., then slowly adding dropwise into the flask 20 parts by mass of tetraethyl orthosilicate over 2.5 h, and continuing the reaction for 6 h after completion of the addition, thereby obtaining the nano-silica precursor; and 2) the step of aging the nano-silica precursor: transferring the nano-silica precursor obtained in Step 1) to a thermostatic reactor and aging for 12 h at 120° C., and then filtering the resultant precipitate, washing the "cake" three times with ethanol and drying it in vacuo, thereby obtaining modified nano-silica particles.

The pigment dispersion of this example was prepared by mixing a solute with solvent and inducing a crosslinking reaction therein. The average particle size of the solid particles in the pigment dispersion is 100 nm, and the solute comprises, based on 100% by mass of the pigment dispersion, 2% of the modified nano-silica, 6% of a dispersant, 2% of a binder resin, 10% of a pigment, 0.3% of a photoinitiator, 0.1% of quantum dots (CdTe, particle size: 10 nm), and the rest 79.6% of solvent.

The process for preparing the pigment dispersion comprises the steps of:

weighing indanthrene blue RS as a pigment, TR-7010 (a polyurethane) as a dispersant, propylene glycol monomethyl ether acetate as a solvent, and carboxymethyl cellulose as a binder resin, according to the aforesaid mass percentages, and mixing them in a disperser at a speed of 500 rpm for 1 h, and then dispersing the obtained mixture in a high speed stirring mill for 5 h after adding appropriate amount of zirconium oxide beads having an average particle size of 0.3 to 1.0 mm, and then removing the zirconium oxide beads after completion of milling, thereby obtaining a pigment-containing dispersion liquid; and adding the modified nano-silica of this example and the initiator benzil into the pigment-containing dispersion liquid under stirring, and inducing a crosslinking reaction, after stirring for 1 h, under the irradiation of a UV lamp (GE-B8565) for 40 s, thereby obtaining a pigment dispersion.

The photosensitive resin composition of this example comprises (mass %): 30% of the pigment dispersion as prepared above, 2% of an alkali-soluble resin, 0.3% of a photoinitiator, 5% of a polymerizable monomer, and the rest of solvent.

The process for preparing the photosensitive resin composition comprises the steps of:

weighing the pigment dispersion prepared in this example, methacrylic acid/benzyl methacrylate copolymer as an alkali-soluble acrylic copolymer resin (acid value: 50), ethyl methacrylate as a polymerizable monomer, and propylene glycol monomethyl ether acetate as a solvent, according to the aforesaid mass percentages, and mixing them in a ball mill at a speed of 500 rpm for 3 h, and then dispersing the obtained mixture in a high speed stirring mill for 5 h after adding appropriate amount of zirconium oxide beads having an average particle size of 0.3 to 1.0 mm, then removing the zirconium oxide beads after completion of milling, and then adding the photoinitiator benzil.

The resultant photosensitive resin composition was coated onto a transparent glass substrate provided with a black matrix. After a photoetching process including exposure for 20 s, development and so on, a color layer (i.e., a photoresist layer) of a color filter was obtained. The appearance of the photoresist layer was inspected, and the results are shown in Table 1.

A display panel comprising the color filter was prepared, and further was packaged in a display device. The brightness of the display device was tested at the same power as the Comparative Example, and the results are shown in Table 1.

Example 3

This example provides modified nano-silica particles and a method of preparing the same, as well as a pigment dispersion and a photosensitive resin composition comprising the same.

The modified nano-silica particles provided in this example have unsaturated double bonds grafted on the surface thereof, and have an average particle size of 20 nm.

The method for preparation of the aforesaid modified nano-silica particles comprises the following steps:

1) the step of reacting to produce a nano-silica precursor: dissolving quantum dots (CdTe, particle size: 1 nm) in anhydrous ethanol to form a solution of the quantum dots; and weighing 30 parts by mass of anhydrous ethanol, 10 parts by mass of deionized water, 8 parts by mass of 25% (v/v)

ammonia, 5 parts by mass of vinyl triethoxysilane, and predetermined amount of the quantum dots solution (based on the mass of the modified nano-silica finally obtained, the amount of the quantum dots being 23.3%), and mixing them uniformly in a four-necked flask, then raising the temperature of the resultant mixture to 50° C., then slowly adding dropwise into the flask 25 parts by mass of tetraethyl orthosilicate over 2.5 h, and continuing the reaction for 6 h after completion of the addition, thereby obtaining the nano-silica precursor; and 2) the step of aging the nano-silica precursor: transferring the nano-silica precursor obtained in Step 1) to a thermostatic reactor and aging for 12 h at 120° C., and then filtering the resultant precipitate, washing the "cake" three times with ethanol and drying it in vacuo, thereby obtaining modified nano-silica particles.

The pigment dispersion of this example was prepared by mixing a solute with solvent and inducing a crosslinking reaction therein. The average particle size of the solid particles in the pigment dispersion is 80 nm, and the solute comprises, based on 100% by mass of the pigment dispersion, 3% of the modified nano-silica, 4% of a dispersant, 3% of a binder resin, 14% of a pigment, 0.4% of a photoinitiator, 0.7% of quantum dots (CdTe, particle size: 1 nm), and the rest 74.9% of solvent.

The process for preparing the pigment dispersion comprises the steps of:

weighing benzimidazolone yellow H4G PY151 as a pigment, BYK-130 (polyaminoamide, Disperbyk-130) as a dispersant, propylene glycol monomethyl ether acetate as a solvent, and methacrylic acid/methyl methacrylate resin as a binder resin, according to the aforesaid mass percentages, and mixing them in a disperser at a speed of 500 rpm for 1 h, and then dispersing the obtained mixture in a high speed stirring mill for 5 h after adding appropriate amount of zirconium oxide beads having an average particle size of 0.3 to 1.0 mm, and then removing the zirconium oxide beads after completion of milling, thereby obtaining a pigment-containing dispersion liquid; and adding the modified nano-silica of this example and the initiator dibenzoyl phenyl phosphine oxide into the pigment-containing dispersion liquid under stirring, and inducing a crosslinking reaction, after stirring for 2 h, under the irradiation of a UV lamp (GE-B8565) for 60 s, thereby obtaining a pigment dispersion.

The photosensitive resin composition of this example comprises (mass %): 35% of the pigment dispersion as prepared above, 3% of an alkali-soluble resin, 0.4% of a photoinitiator, 3% of a polymerizable monomer, and the rest of solvent.

The process for preparing the photosensitive resin composition comprises the steps of:

weighing the pigment dispersion prepared in this example, methacrylic acid/methyl methacrylate/styrene copolymer as an alkali-soluble acrylic copolymer resin (acid value: 60), bisphenol A bis(acryloxyethyl) ether as a polymerizable monomer, and propylene glycol monomethyl ether acetate as a solvent, according to the aforesaid mass percentages, and mixing them in a ball mill at a speed of 500 rpm for 3 h, and then dispersing the obtained mixture in a high speed stirring mill for 5 h after adding appropriate amount of zirconium oxide beads having an average particle size of 0.3 to 1.0 mm, then removing the zirconium oxide beads after completion of milling, and then adding the photoinitiator dibenzoyl phenyl phosphine oxide.

The resultant photosensitive resin composition was coated onto a transparent glass substrate provided with a black matrix. After a photoetching process including exposure for 20 s, development and so on, a color layer (i.e., a photoresist layer) of a color filter was obtained. The appearance of the photoresist layer was inspected, and the results are shown in Table 1.

A display panel comprising the color filter was prepared, and further was packaged in a display device. The brightness of the display device was tested at the same power as the Comparative Example, and the results are shown in Table 1.

Example 4

This example provides modified nano-silica particles and a method of preparing the same, as well as a pigment dispersion and a photosensitive resin composition comprising the same.

The modified nano-silica particles provided in this example have unsaturated double bonds grafted on the surface thereof, and have an average particle size of 20 nm.

The method for preparation of the aforesaid modified nano-silica particles comprises the following steps:

1) the step of reacting to produce a nano-silica precursor: dissolving quantum dots (CdTe, particle size: 2 nm) in anhydrous ethanol to form a solution of the quantum dots; and weighing 35 parts by mass of anhydrous ethanol, 8 parts by mass of deionized water, 4 parts by mass of 25% (v/v) ammonia, 7 parts by mass of vinyl triacetoxysilane, and predetermined amount of the quantum dots solution (based on the mass of the modified nano-silica finally obtained, the amount of the quantum dots being 25%), and mixing them uniformly in a four-necked flask, then raising the temperature of the resultant mixture to 70° C., then slowly adding dropwise into the flask 23 parts by mass of tetraethyl orthosilicate over 2.7 h, and continuing the reaction for 12 h after completion of the addition, thereby obtaining the nano-silica precursor; and 2) the step of aging the nano-silica precursor: transferring the nano-silica precursor obtained in Step 1) to a thermostatic reactor and aging for 20 h at 140° C., and then filtering the resultant precipitate, washing the "cake" three times with ethanol and drying it in vacuo, thereby obtaining modified nano-silica particles.

The pigment dispersion of this example was prepared by mixing a solute with solvent and inducing a crosslinking reaction therein. The average particle size of the solid particles in the pigment dispersion is 40 nm, and the solute comprises, based on 100% by mass of the pigment dispersion, 4% of the modified nano-silica, 5% of a dispersant, 4% of a binder resin, 16% of a pigment, 0.1% of a photoinitiator, 1% of quantum dots (CdTe, particle size: 2 nm), and the rest 69.8% of solvent.

The process for preparing the pigment dispersion comprises the steps of:

weighing indanthrene blue RS as a pigment, BYK-131 as a dispersant, propylene glycol monomethyl ether acetate as a solvent, and isobutylene-maleic acid resin as a binder resin, according to the aforesaid mass percentages, and mixing them in a disperser at a speed of 500 rpm for 1 h, and then dispersing the obtained mixture in a high speed stirring mill for 5 h after adding appropriate amount of zirconium oxide beads having an average particle size of 0.3 to 1.0 mm, and then removing the zirconium oxide beads after completion of milling, thereby obtaining a pigment-containing dispersion liquid; and adding the modified nano-silica of this example and the initiator benzoin dimethyl ether into the pigment-containing dispersion liquid under stirring, and inducing a crosslinking reaction, after stirring for 3 h, under the irradiation of a UV lamp (GE-B8565) for 50 s, thereby obtaining a pigment dispersion.

The photosensitive resin composition of this example comprises (mass %): 38% of the pigment dispersion as prepared above, 6% of an alkali-soluble resin, 0.8% of a photoinitiator, 4% of a polymerizable monomer, and the rest of solvent.

The process for preparing the photosensitive resin composition comprises the steps of:

weighing the pigment dispersion prepared in this example, (meth)acrylic acid/2-hydroxyethyl methacrylate/benzyl methacrylate/methyl methacrylate copolymer as an alkali-soluble acrylic copolymer resin (acid value: 120), pentaerythritol tetra(meth)acrylate as a polymerizable monomer, and propylene glycol monomethyl ether acetate as a solvent, according to the aforesaid mass percentages, and mixing them in a ball mill at a speed of 500 rpm for 3 h, and then dispersing the obtained mixture in a high speed stirring mill for 5 h after adding appropriate amount of zirconium oxide beads having an average particle size of 0.3 to 1.0 mm, then removing the zirconium oxide beads after completion of milling, and then adding the photoinitiator benzoin dimethyl ether.

The resultant photosensitive resin composition was coated onto a transparent glass substrate provided with a black matrix. After a photoetching process including exposure for 20 s, development and so on, a color layer (i.e., a photoresist layer) of a color filter was obtained. The appearance of the photoresist layer was inspected, and the results are shown in Table 1.

A display panel comprising the color filter was prepared, and further was packaged in a display device. The brightness of the display device was tested at the same power as the Comparative Example, and the results are shown in Table 1.

Example 5

This example provides modified nano-silica particles and a method of preparing the same, as well as a pigment dispersion and a photosensitive resin composition comprising the same.

The modified nano-silica particles provided in this example have unsaturated double bonds grafted on the surface thereof, and have an average particle size of 50 nm.

The method for preparation of the aforesaid modified nano-silica particles comprises the following steps:

1) the step of reacting to produce a nano-silica precursor: dissolving quantum dots (CdTe, particle size: 4.5 nm) in anhydrous ethanol to form a solution of the quantum dots; and weighing 25 parts by mass of anhydrous ethanol, 6 parts by mass of deionized water, 5 parts by mass of 25% (v/v) ammonia, 9 parts by mass of vinyl triisopropoxysilane, and predetermined amount of the quantum dots solution (based on the mass of the modified nano-silica finally obtained, the amount of the quantum dots being 10%), and mixing them uniformly in a four-necked flask, then raising the temperature of the resultant mixture to 50° C., then slowly adding dropwise into the flask 18 parts by mass of tetraethyl orthosilicate over 3 h, and continuing the reaction for 8 h after completion of the addition, thereby obtaining the nano-silica precursor; and 2) the step of aging the nano-silica precursor: transferring the nano-silica precursor obtained in Step 1) to a thermostatic reactor and aging for 24 h at 130° C., and then filtering the resultant precipitate, washing the "cake" three times with ethanol and drying it in vacuo, thereby obtaining modified nano-silica particles.

The pigment dispersion of this example was prepared by mixing a solute with solvent and inducing a crosslinking reaction therein. The average particle size of the solid particles in the pigment dispersion is 70 nm, and the solute comprises, based on 100% by mass of the pigment dispersion, 5% of the modified nano-silica, 4.5% of a dispersant, 5% of a binder resin, 18% of a pigment, 0.5% of a photoinitiator, 0.5% of quantum dots (CdTe, particle size: 4.5 nm), and the rest 66.5% of solvent.

The process for preparing the pigment dispersion comprises the steps of:

weighing carbazole dioxazine Violet 19 as a pigment, Disperbyk-161 as a dispersant, propylene glycol monomethyl ether acetate as a solvent, and polyvinyl pyrrolidone as a binder resin, according to the aforesaid mass percentages, and mixing them in a disperser at a speed of 500 rpm for 1 h, and then dispersing the obtained mixture in a high speed stirring mill for 5 h after adding appropriate amount of zirconium oxide beads having an average particle size of 0.3 to 1.0 mm, and then removing the zirconium oxide beads after completion of milling, thereby obtaining a pigment-containing dispersion liquid; and adding the modified nano-silica of this example and the initiator p-benzoyl phenoxy diphenyl iodonium hexafluorophosphate into the pigment-containing dispersion liquid under stirring, and inducing a crosslinking reaction, after stirring for 2.5 h, under the irradiation of a UV lamp (GE-B8565) for 45 s, thereby obtaining a pigment dispersion.

The photosensitive resin composition of this example comprises (mass %): 40% of the pigment dispersion as prepared above, 5% of an alkali-soluble resin, 0.5% of a photoinitiator, 2.5% of a polymerizable monomer, and the rest of solvent.

The process for preparing the photosensitive resin composition comprises the steps of:

weighing the pigment dispersion prepared in this example, (meth)acrylic acid/benzyl methacrylate/N-phenyl maleimide copolymer as an alkali-soluble acrylic copolymer resin (acid value: 100), styrene as a polymerizable monomer, and propylene glycol monomethyl ether acetate as a solvent, according to the aforesaid mass percentages, and mixing them in a ball mill at a speed of 500 rpm for 3 h, and then dispersing the obtained mixture in a high speed stirring mill for 5 h after adding appropriate amount of zirconium oxide beads having an average particle size of 0.3 to 1.0 mm, then removing the zirconium oxide beads after completion of milling, and then adding the photoinitiator p-benzoyl phenoxy diphenyl iodonium hexafluorophosphate.

The resultant photosensitive resin composition was coated onto a transparent glass substrate provided with a black matrix. After a photoetching process including exposure for 20 s, development and so on, a color layer (i.e., a photoresist layer) of a color filter was obtained. The appearance of the photoresist layer was inspected, and the results are shown in Table 1.

A display panel comprising the color filter was prepared, and further was packaged in a display device. The brightness of the display device was tested at the same power as the Comparative Example, and the results are shown in Table 1.

TABLE 1

Comparison of appearance of the photoresist layers and brightness of the display devices

| Example No. | Appearance of the photoresist layer | Brightness (the result of Comparative Example serving as a reference value) |
| --- | --- | --- |
| Comparative Example | With shrinkage and collapse | Reference value |
| Example 1 | No shrinkage or collapse | Reference value |
| Example 2 | No shrinkage or collapse | Improved by 9% |
| Example 3 | No shrinkage or collapse | Improved by 8% |
| Example 4 | No shrinkage or collapse | Improved by 13% |
| Example 5 | No shrinkage or collapse | Improved by 12% |

As shown in Table 1, the photoresist layers comprising the modified nano-silica prepared according to the present invention exhibited no shrinkage or collapse, whereas shrinkage and collapse occurred in the photoresist layer of Comparative Example. Such results demonstrate that the modified nano-silica according to the present invention can be polymerized and crosslinked with polymerizable monomers to form an interpenetrating composite network structure, so as to enhance the support effect. The display devices of Examples 2-5 comprising quantum dots have an improved brightness, compared to the display devices of Comparative Example and Example 1 without quantum dots. Such results demonstrate that the addition of quantum dots has significant effect on improvement of the brightness of display devices and on energy saving.

Since the modified nano-silica particles according to the present invention have unsaturated double bonds on the surface thereof, they can crosslink with other polymeric materials. Meanwhile, since the modified nano-silica particles having a particle size according to the present invention are much smaller than the size of the organic pigment capable of being dispersed, they will be separated by the steric hindrance effect of the binder resin covered on the surface of the pigment after they are added to the pigment paste and evenly dispersed. Furthermore, the functional groups of the modified nano-silica particles per se can prevent them from agglomerating and thus are suitable for forming nodes of a crosslinked network that connect the chain segments of polymeric materials to form a network structure.

According to the present invention, modified nano-silica particles are added in a pigment dispersion to serve as crosslinking nodes, and the binder resin containing unsaturated double bonds in the dispersion is initiated to undergo crosslinking polymerization to form a network polymeric resin system in the dispersion. As such, the effect of encapsulation and stabilization of the pigment particles is enhanced and the occurrence of particle agglomeration and precipitation is effectively decreased.

During the exposure stage after a photosensitive resin composition is prepared by adding an alkali-soluble resin, a polymerizable monomer, a photoinitiator and other additives to a pigment dispersion, a network structure is formed by the polymerization and crosslinking of the polymerizable monomer, which combines with the network crosslinked structure comprising the nano-silica particles in the pigment dispersion to form an interpenetrating composite network structure. The two kinds of network in the composite structure interpenetrate and cooperate with each other such that they can support each other in the post-baking stage, thereby reducing the thermal expansion of the resultant film as well as the occurrence of shrinkage and collapse phenomena in the surface of the film, and effectively enhancing the heat-resistance, chemical-resistance, mechanical properties and abrasion-resistance of the film, while maintaining the transparency and gloss of the film without any adverse effect on the optical properties of the photosensitive resin.

It should be understood that the embodiments described above are provided for the purpose of illustrating the principle of the invention, while the invention is not limited thereto. It will be apparent to a person skilled in the art that various changes and modifications can be made to the invention without departing from the spirit of the invention, and such changes and modifications are within the scope of the present invention.

The invention claimed is:

1. A pigment dispersion, characterized in that the pigment dispersion is prepared by dispersing a solute in a solvent and inducing a crosslinking reaction therein, and the average particle size of the solid particles in the pigment dispersion ranges from 40 nm to 100 nm; and the solute comprises: based on 100% by mass of the pigment dispersion, 1% to 5% of modified nano-silica particles which have unsaturated double bonds grafted on the surface thereof and have an average particle size in the range of 5 nm to 50 nm, 3% to 6% of a dispersant, 2% to 6% of a binder resin, 10% to 20% of pigment, and 0.1% to 0.5% of a photoinitiator.

2. The pigment dispersion according to claim 1, characterized in that the solute further comprises 0.2% to 1% of quantum dots, based on 100% by mass of the pigment dispersion.

3. The pigment dispersion according to claim 2, characterized in that the particle size of the quantum dots is in the range of 1 nm to 10 nm.

4. The pigment dispersion according to claim 1, characterized in that the dispersant is a block copolymer composed of segment(s) having affinity to the solvent and segment(s) comprising a nitrogen atom-containing functional group.

5. The pigment dispersion according to claim 4, characterized in that the block copolymer is one or more of acrylic block copolymers composed of segment(s) having affinity to the solvent and segment(s) comprising a nitrogen atom-containing functional group, polyurethane block copolymers composed of segment(s) having affinity to the solvent and segment(s) comprising a nitrogen atom-containing functional group, polyaminoamide block copolymers composed of segment(s) having affinity to the solvent and segment(s) comprising a nitrogen atom-containing functional group, polyether ester block copolymers composed of segment(s) having affinity to the solvent and segment(s) comprising a nitrogen atom-containing functional group, and aliphatic polycarboxylic acid block copolymers composed of segment(s) having affinity to the solvent and segment(s) comprising a nitrogen atom-containing functional group.

6. The pigment dispersion according to claim 1, characterized in that the pigment is one or more of azo, phthalocyanine, quinacridone, benzimidazolone, indanthrene, and dioxazine pigments.

7. The pigment dispersion according to claim 1, characterized in that the binder resin has unsaturated double bonds.

8. The pigment dispersion according to claim 7, characterized in that the binder resin is one or more of polyvinyl alcohols, hydroxypropyl celluloses, carboxymethyl celluloses, hydroxyethyl celluloses, methyl celluloses, styrene-acrylic acid resins, styrene-acrylic acid-acrylate resins, styrene-maleic half ester resins, methacrylic acid-methacrylate resins, isobutylene-maleic acid resins, rosin-modified maleic acid resins, polyvinyl pyrrolidone, polyallylamine, polyvinyl chloride, chlorinated polypropylene, and polyethylene imine, each having unsaturated double bonds.

9. The pigment dispersion according to claim 1, characterized in that the photoinitiator is one or more of benzoin and its derivatives, benzil, alkylphenone, acyl phosphorus oxides, benzophenones, thioxanthones, diaryl iodonium salts, triaryl iodonium salts, alkyl iodonium salts, and cumene ferrocene hexafluorophosphate.

10. A photosensitive resin composition, characterized by comprising: based on 100% by mass of the photosensitive resin composition, 30% to 40% of a pigment dispersion, 1.5% to 6% of an alkali-soluble resin, 2% to 5% of a polymerizable monomer, and 0.2% to 0.8% of a photoinitiator,
wherein the pigment dispersion is prepared by dispersing a solute in a solvent and inducing a crosslinking reaction therein, and the average particle size of the solid particles in the pigment dispersion ranges from 40 nm to 100 nm; and
wherein the solute comprises: based on 100% by mass of the pigment dispersion, 1% to 5% of a modified nano-silica particles which have unsaturated double bonds grafted on the surface thereof and have an average particle size in the range of 5 nm to 50 nm, 3% to 6% of a dispersant, 2% to 6% of a binder resin, 10% to 20% of pigment, and 0.1% to 0.5% of a photoinitiator.

11. The photosensitive resin composition according to claim 10, characterized in that the alkali-soluble resin is an acrylic copolymer, and the acid value of the acrylic copolymer is in the range of 50 to 150.

12. The photosensitive resin composition according to claim 11, characterized in that the acrylic copolymer is selected from (meth)acrylic acid/methyl (meth)acrylate copolymer, (meth)acrylic acid/benzyl (meth)acrylate copolymer, (meth)acrylic acid/2-hydroxyethyl (meth)acrylate/benzyl (meth)acrylate copolymer, (meth)acrylic acid/methyl (meth)acrylate/styrene copolymer, (meth)acrylic acid/2-hydroxyethyl (meth)acrylate/benzyl (meth)acrylate/methyl (meth)acrylate copolymer, and (meth)acrylic acid/benzyl (meth)acrylate/N-phenyl maleimide copolymer, and the acrylic copolymer has an acid value in the range of 60-120.

13. The photosensitive resin composition according to claim 10, characterized in that the polymerizable monomer is one or more of hexylphenyl carbitol acrylate, N-vinyl pyrrolidone, 2-ethylhexyl carbitol acrylate, ethyl (meth)acrylate, bisphenol A bis(acryloxyethyl) ether, pentaerythritol tetra(meth)acrylate, acrylonitrile, styrene, and vinyl acetate.

* * * * *